(12) United States Patent
Harata et al.

(10) Patent No.: US 8,726,135 B2
(45) Date of Patent: May 13, 2014

(54) WIRELESS COMMUNICATION SYSTEM, WIRELESS COMMUNICATION APPARATUS, AND WIRELESS COMMUNICATION METHOD

(75) Inventors: Masakazu Harata, Kawasaki (JP); Hidetoshi Shirasawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 103 days.

(21) Appl. No.: 13/480,371

(22) Filed: May 24, 2012

(65) Prior Publication Data

US 2013/0019144 A1    Jan. 17, 2013

(30) Foreign Application Priority Data

Jul. 12, 2011   (JP) ................. 2011-153940

(51) Int. Cl.
*H03M 13/00*   (2006.01)
(52) U.S. Cl.
USPC .......................................... 714/776; 714/774
(58) Field of Classification Search
CPC . G06F 11/1004; H03M 13/093; H04L 1/0078
USPC ................................. 714/776, 774
See application file for complete search history.

(56) References Cited

U.S. PATENT DOCUMENTS

| | | | | |
|---|---|---|---|---|
| 4,145,683 A | * | 3/1979 | Brookhart | 714/758 |
| 5,844,918 A | * | 12/1998 | Kato | 714/751 |
| 6,092,231 A | * | 7/2000 | Sze | 714/758 |
| 6,421,805 B1 | * | 7/2002 | McAuliffe | 714/756 |
| 2002/0027684 A1 | * | 3/2002 | Ait Sab et al. | 359/124 |
| 2003/0123409 A1 | * | 7/2003 | Kwak et al. | 370/335 |
| 2004/0003333 A1 | * | 1/2004 | Herley et al. | 714/748 |

FOREIGN PATENT DOCUMENTS

JP   2010-154250 A   7/2010

* cited by examiner

*Primary Examiner* — M. Mujtaba K Chaudry
(74) *Attorney, Agent, or Firm* — Maschoff Brennan

(57) ABSTRACT

A wireless communication system includes: a dividing unit to divide data into a plurality of first code blocks; a generation unit to generate first error detection information for each of the plurality of code blocks; a transmission unit to wirelessly transmit at least one of the plurality of first code blocks using a first channel and the first error detection information using a second channel; a reception unit to receive a plurality of second code blocks and second error detection information transmitted wirelessly; and a detection unit to execute error detection on each of the plurality of second code blocks using the second error detection information and to control a continuation of the error detection for the code blocks based on a result of the error detection.

12 Claims, 14 Drawing Sheets

US 8,726,135 B2

WIRELESS COMMUNICATION SYSTEM, WIRELESS COMMUNICATION APPARATUS, AND WIRELESS COMMUNICATION METHOD

CROSS-REFERENCE TO RELATED APPLICATION(S)

This application is based upon and claims the benefit of priority of the prior Japanese Patent Application No. 2011-153940, filed on Jul. 12, 2011, the entire contents of which are incorporated herein by reference.

FIELD

The embodiment discussed herein is related to a wireless communication system, a wireless communication apparatus, and a wireless communication method.

BACKGROUND

Reception data divided into a plurality of code blocks is subjected to error correction decoding. For example, one of the plurality of code blocks obtained as a result of the division is selected, and the error correction decoding is repeated for the selected code block. The error correction decoding is repeated the same number of times for each of the other code blocks that have not been subjected to the error correction decoding.

The related art is disclosed in Japanese Laid-open Patent Publication No. 2010-154250 and other publications.

SUMMARY

According to one aspect of the embodiments, a wireless communication system includes: a dividing unit to divide data into a plurality of first code blocks; a generation unit to generate first error detection information for each of the plurality of code blocks; a transmission unit to wirelessly transmit at least one of the plurality of first code blocks using a first channel and the first error detection information using a second channel; a reception unit to receive a plurality of second code blocks and second error detection information transmitted wirelessly; and a detection unit to execute error detection on each of the plurality of second code blocks using the second error detection information and to control a continuation of the error detection for the code blocks based on a result of the error detection.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Figure 1:
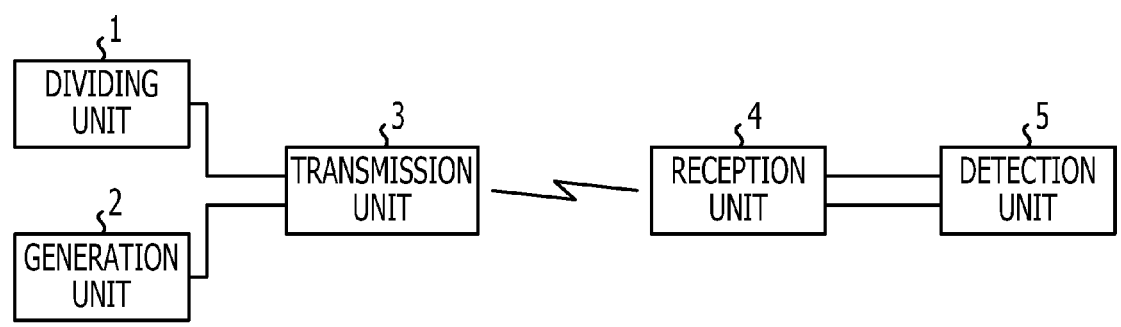
FIG. 1 illustrates an exemplary wireless communication system.

Error correction decoding for each of the other code blocks that have not been subjected to the error correction decoding may be completed by repeating the error correction decoding a smaller number of times than the number of times the error correction decoding has been repeated for the selected code block. Therefore, the time taken for a wireless communication apparatus to complete a turbo decoding process may increase, thereby the power consumption increasing.

Error detection information is generated for each of the code blocks obtained by dividing data, and error detection is repeated for each of the code blocks using the error detection information for each of the code blocks. The repetition of the error detection may be stopped when an error is no longer included in results of the error detection. The same components may be given the same reference numerals, and redundant description thereof may be omitted or reduced.

FIG. 1 illustrates an exemplary wireless communication system. The wireless communication system includes a dividing unit 1, a generation unit 2, a transmission unit 3, a reception unit 4, and a detection unit 5. The dividing unit 1, the generation unit 2, and the transmission unit 3 may be included in a wireless communication apparatus on the transmission side. The reception unit 4 and the detection unit 5 may be included in a wireless communication apparatus on the reception side.

The dividing unit 1 divides data into a plurality of code blocks. The generation unit 2 generates error detection information for each of the code blocks. The transmission unit 3 wirelessly transmits the code blocks using a first channel. The transmission unit 3 wirelessly transmits the error detection information using a second channel.

The reception unit 4 receives the code blocks and the error detection information that have been wirelessly transmitted. The detection unit 5 executes error detection on each of the code blocks received by the reception unit 4 using the error detection information received by the reception unit 4. The detection unit 5 executes control a continuation and a stop of the error detection on a code block based on results of the error detection.

Figure 2:
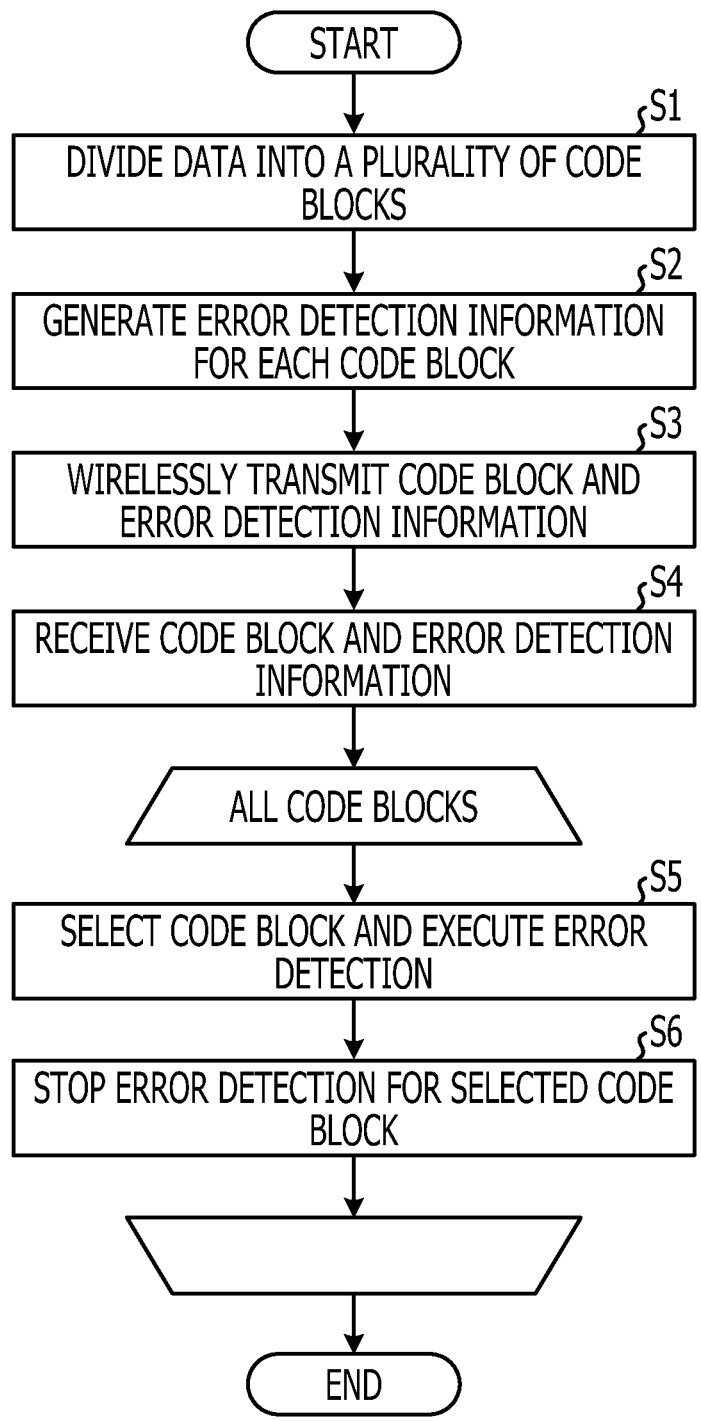
FIG. 2 illustrates an exemplary wireless communication method.

FIG. 2 illustrates an exemplary wireless communication method. When wireless communication begins between the wireless communication apparatus on the transmission side and the wireless communication apparatus on the reception side, the dividing unit 1 in the wireless communication apparatus on the transmission side divides data into a plurality of code blocks (an operation S1). The generation unit 2 in the wireless communication apparatus on the transmission side generates error detection information for each of the code blocks (an operation S2). The transmission unit 3 in the wireless communication apparatus on the transmission side wirelessly transmits the code blocks using the first channel and the error correction information using the second channel (an operation S3).

The reception unit 4 in the wireless communication apparatus on the reception side receives the code blocks and the error detection information transmitted from the wireless communication apparatus on the transmission side (an operation S4). The detection unit 5 in the wireless communication apparatus on the reception side executes error detection on each of the code blocks received by the reception unit 4 using the error detection information received by the reception unit 4. The detection unit 5 in the wireless communication apparatus on the reception side executes control a continuation and a stop of the error detection on a code block based on results of the error detection.

For example, the detection unit 5 selects one of the plurality of code blocks received by the reception unit 4 and executes the error detection on the selected code block using the corresponding error detection information (an operation S5). If no error is included in results of the error detection executed on the selected code block, the detection unit 5 stops the error detection for the code block (an operation S6). The detection unit 5 may execute the processes in the operations S5 and S6 on all the code blocks received by the reception unit 4. When the error detection for all the code blocks received by the reception unit 4 is completed, the series of processes illustrated in FIG. 2 may be terminated.

Since the error detection is executed on each of the code blocks and the error detection for a code block that no longer includes an error is stopped in the wireless communication apparatus on the reception side, the time taken to complete the decoding process may be reduced. The power consumption of the wireless communication apparatus on the reception side may be reduced.

For example, the wireless communication system illustrated in FIG. 1 may be applied to a High-Speed Packet Access Plus (Evolution) (HSPA+) system. For example, a wireless communication apparatus on the transmission side of the HSPA+ system may be a base station. For example, a wireless communication apparatus on the reception side may be a terminal. The wireless communication system illustrated in FIG. 1 may be applied to other wireless communication systems including Wideband Code Division Multiple Access (W-CDMA) such as HSPA and Long Term Evolution (LTE), or to future wireless communication systems.

Figure 3:
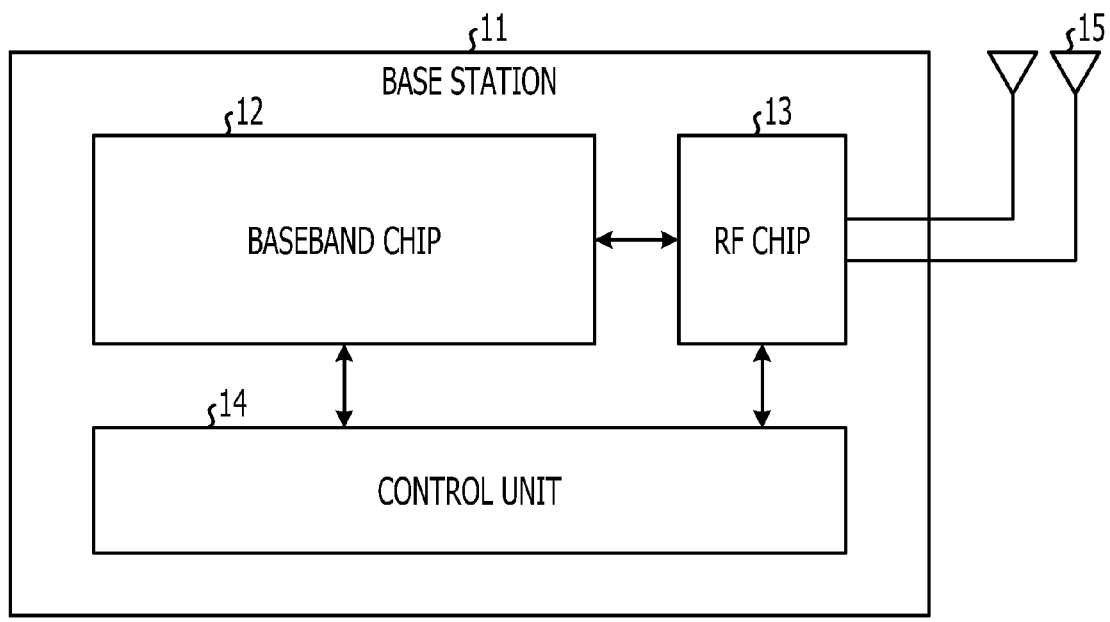
FIG. 3 illustrates an exemplary base station.

FIG. 3 illustrates an exemplary base station. In FIG. 3, a hardware configuration may be illustrated. A base station 11 includes a baseband chip 12 that executes a baseband process, a radio frequency (RF) chip 13 that executes a wireless transmission/reception process, a control unit 14, and an antenna 15. The RF chip 13 may correspond to the transmission unit 3 illustrated in FIG. 1. The control unit 14 controls the baseband process executed by the baseband chip 12 and the wireless transmission/reception process executed by the RF chip 13.

Figure 4:
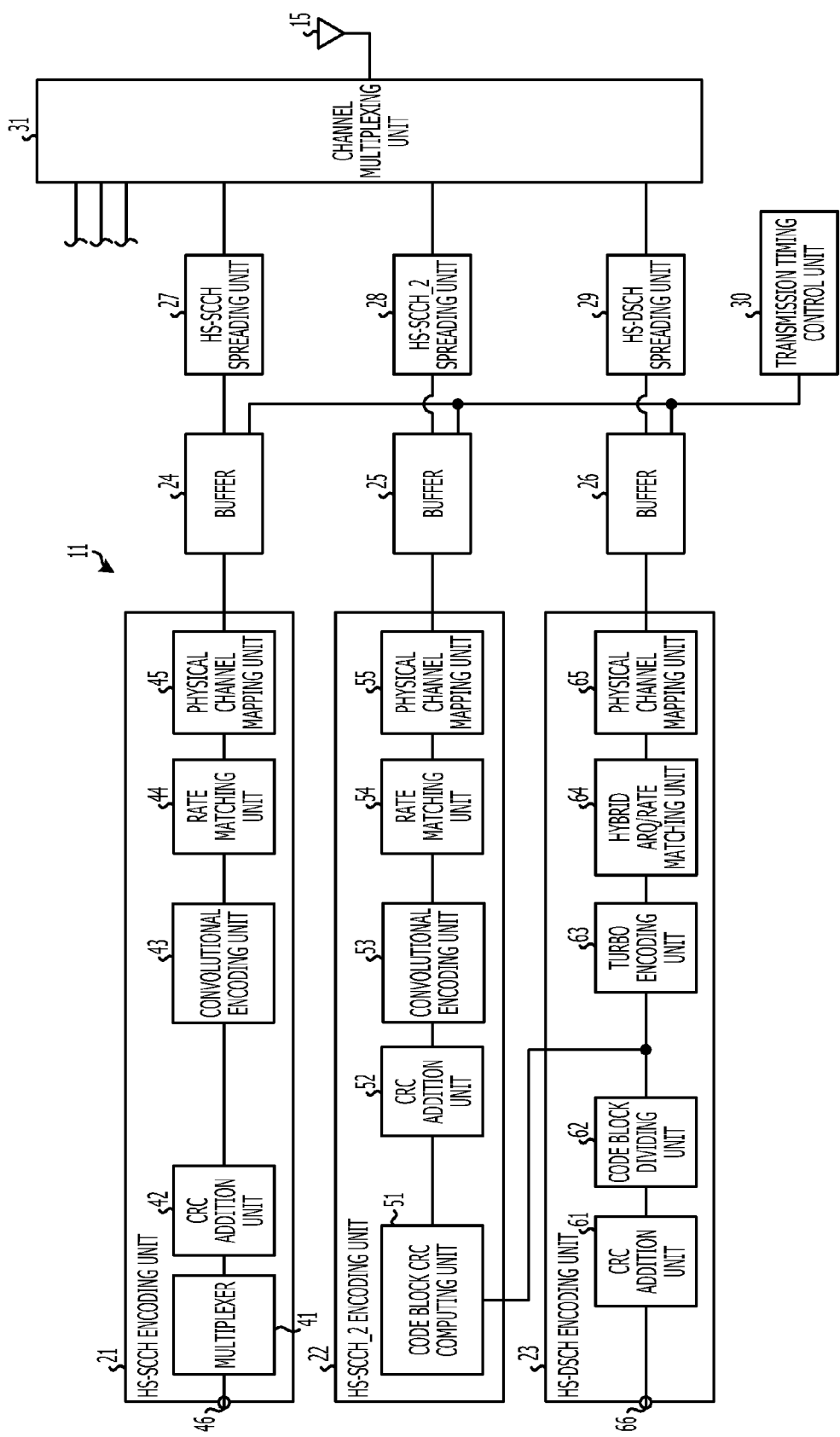
FIG. 4 illustrates an exemplary base station.
Figure 5:
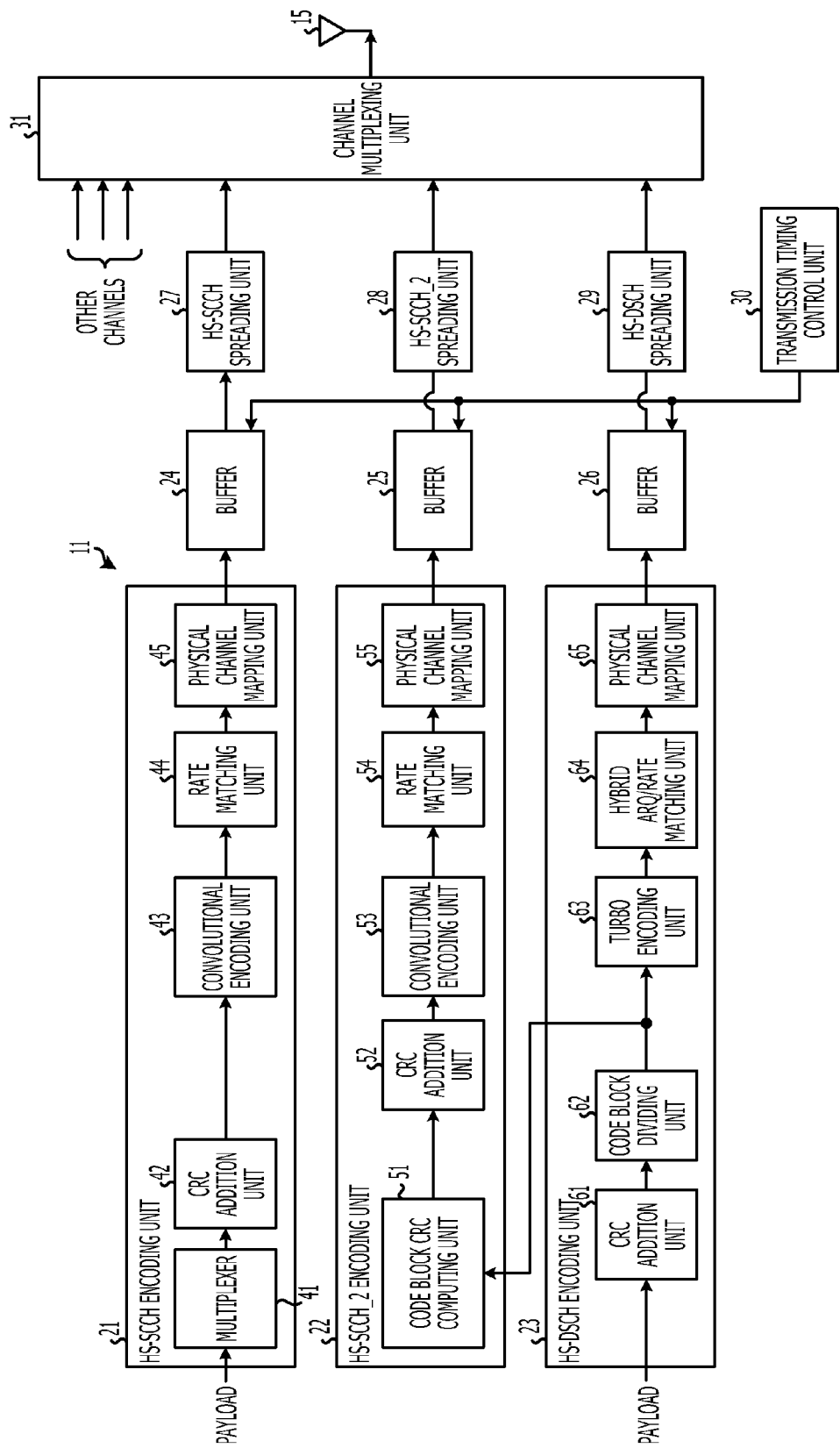
FIG. 5 illustrates an exemplary base station.

FIG. 4 illustrates an exemplary base station. In FIG. 4, a functional configuration may be illustrated. FIG. 5 illustrates an exemplary base station. In FIG. 5, the flow of a signal may be illustrated. As illustrated in FIGS. 4 and 5, the base station 11 includes a High-Speed Shared Control Channel (HS-SCCH) encoding unit 21, an HS-SCCH_2 encoding unit 22, a High-Speed Downlink Shared Channel (HS-DSCH) encoding unit 23, buffers 24, 25, and 26, an HS-SCCH spreading unit 27, an HS-SCCH_2 spreading unit 28, an HS-DSCH spreading unit 29, a transmission timing control unit 30, and a channel multiplexing unit 31.

The HS-SCCH encoding unit 21 encodes data transmitted using an HS-SCCH, which is a control channel. By receiving a signal using the HS-SCCH, the terminal on the reception side obtains information regarding a code for receiving a signal using an HS-DSCH, a modulation method, and the like. The buffer 24 is coupled to the HS-SCCH encoding unit 21 and holds a signal output from the HS-SCCH encoding unit 21.

The HS-SCCH_2 encoding unit 22 encodes data transmitted using a second HS-SCCH (HS-SCCH_2), which is a control channel. From a signal transmitted using the HS-SCCH_2, the terminal on the reception side obtains information regarding a cyclic redundancy check (CRC) for each code block, which is a unit for an encoding process on the transmission side. The buffer 25 is coupled to the HS-SCCH_2 encoding unit 22 and holds a signal output from the HS-SCCH_2 encoding unit 22. In the wireless communication system illustrated in FIG. 4, the HS-SCCH_2 is provided separately from the HS-SCCH.

The HS-DSCH encoding unit 23 encodes data transmitted using an HS-DSCH, which is a data channel. The buffer 26 is coupled to the HS-DSCH encoding unit 23 and stores a signal output from the HS-DSCH encoding unit 23.

Figure 6:
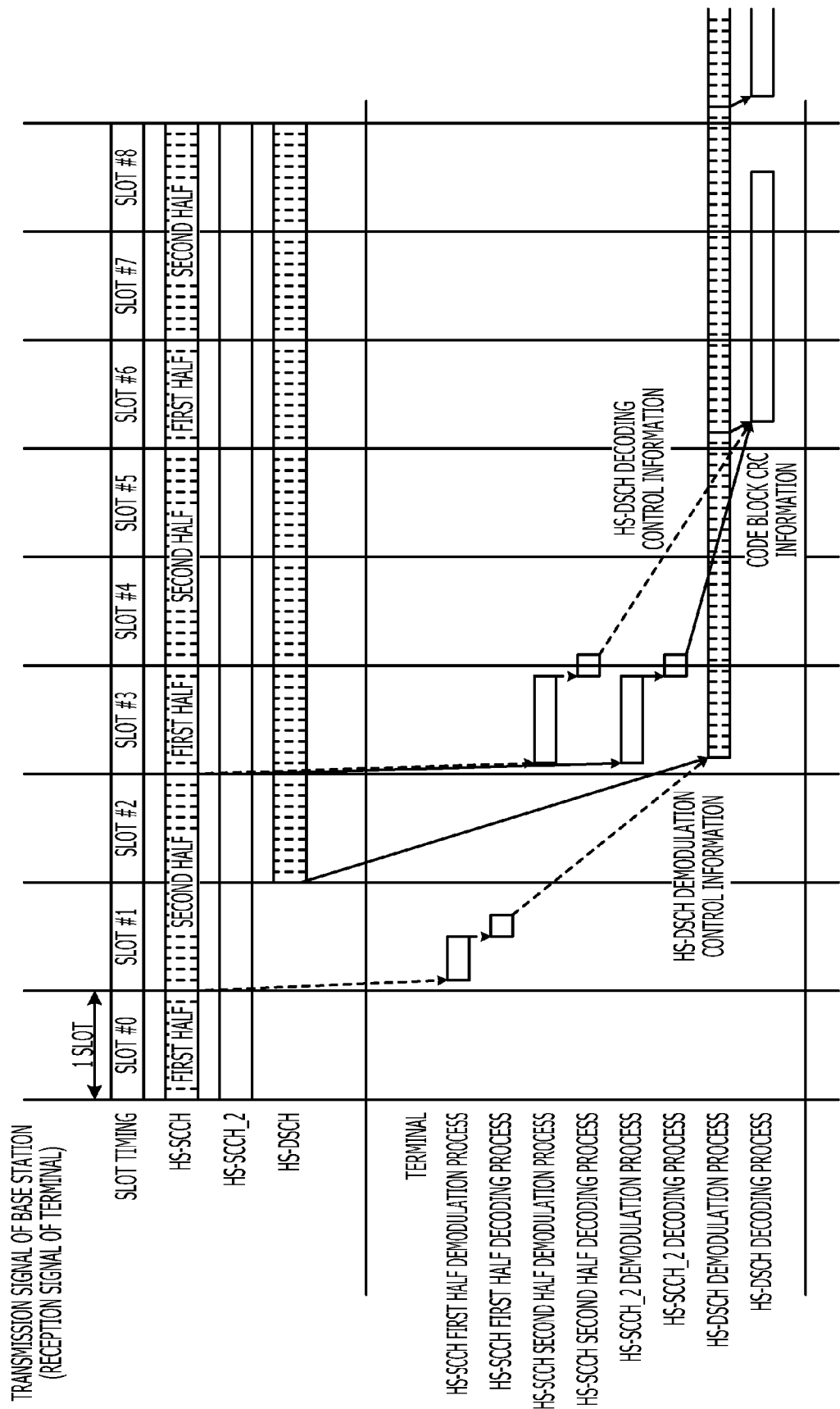
FIG. 6 illustrates an exemplary timing of data process.

The transmission timing control unit 30 is coupled to the buffers 24, 25, and 26 and controls the output timing of the signals held by the buffers 24, 25, and 26, respectively. FIG. 6 illustrates an exemplary timing of data processing. The timing illustrated in FIG. 6 may be the timing of transmission signals of the base station illustrated in FIG. 3 or 4 and the timing of data processing executed in the terminal. The signals illustrated in FIG. 6 may be transmitted from the base station. As illustrated in FIG. 6, for example, the signals of the HS-SCCH and the HS-SCCH_2 may be transmitted at the same timing. The held signals may be output substantially at the same timing from the buffers 24 and 25, respectively, by the transmission timing control unit 30.

For example, the signal of the HS-DSCH may be transmitted at a timing two slots later than the signal of the HS-SCCH. The signal held in the buffer 26 by the transmission timing control unit 30 may be output at a timing two slots later than the signal held in the buffer 24.

The HS-SCCH spreading unit 27 is coupled to the buffer 24 and executes a spreading process on a signal output from the buffer 24. The HS-SCCH_2 spreading unit 28 is coupled to the buffer 25 and executes a spreading process on a signal output from the buffer 25. The HS-DSCH spreading unit 29 is coupled to the buffer 26 and executes a spreading process on a signal output from the buffer 26.

The channel multiplexing unit 31 is coupled to the HS-SCCH spreading unit 27, the HS-SCCH_2 spreading unit 28, and the HS-DSCH spreading unit 29 and multiplexes signals output from the HS-SCCH spreading unit 27, the HS-SCCH_2 spreading unit 28, and the HS-DSCH spreading unit 29, respectively. The channel multiplexing unit 31 may multiplex a signal obtained by encoding another piece of data. A signal output from the channel multiplexing unit 31 is, for example, modulated by the RF chip 13 illustrated in FIG. 3 to obtain a signal having a radio frequency, which is then transmitted from the antenna 15.

The HS-SCCH encoding unit 21 includes a multiplexer 41, a CRC addition unit 42, a convolutional encoding unit 43, a rate matching unit 44, and a physical channel mapping unit 45.

The multiplexer 41 is coupled to an input terminal 46 to which payload data is supplied from a superior layer, and sequentially selects a piece of the payload data transmitted using the HS-SCCH based on a control signal. The CRC addition unit 42 is coupled to the multiplexer 41 and adds CRC information to the payload data transmitted using the HS-SCCH. The convolutional encoding unit 43 is coupled to the CRC addition unit 42 and executes a convolutional encoding process on data obtained by adding the CRC information to the payload data.

The rate matching unit 44 is coupled to the convolutional encoding unit 43 and executes a rate matching process on a signal output from the convolutional encoding unit 43. The physical channel mapping unit 45 is coupled to the rate matching unit 44 and maps a signal output from the rate matching unit 44 to a physical channel.

The HS-SCCH_2 encoding unit 22 includes a code block CRC computing unit 51. The code block CRC computing unit 51 may be the generation unit 2 illustrated in FIG. 1. The HS-SCCH_2 encoding unit 22 includes a CRC addition unit 52, a convolutional encoding unit 53, a rate matching unit 54, and a physical channel mapping unit 55.

The code block CRC computing unit 51 is coupled to a code block dividing unit 62 in the HS-DSCH encoding unit 23. The code block CRC computing unit 51 executes an arithmetic operation to generate, for example, CRC information as error detection information for each of code blocks supplied from the code block dividing unit 62, and combines the generated pieces of CRC information for the code blocks.

The CRC addition unit 52 is coupled to the code block CRC computing unit 51 and adds CRC information to data obtained by combining the pieces of CRC information for the code blocks. The convolutional encoding unit 53 is coupled to the CRC addition unit 52 and executes a convolutional encoding process on data obtained by adding the CRC information to the data obtained by combining the pieces of CRC information for the code blocks.

The rate matching unit 54 is coupled to the convolutional encoding unit 53 and executes a rate matching process on a signal output from the convolutional encoding unit 53. The physical channel mapping unit 55 is coupled to the rate matching unit 54 and maps a signal output from the rate matching unit 54 to a physical channel.

Figure 7:
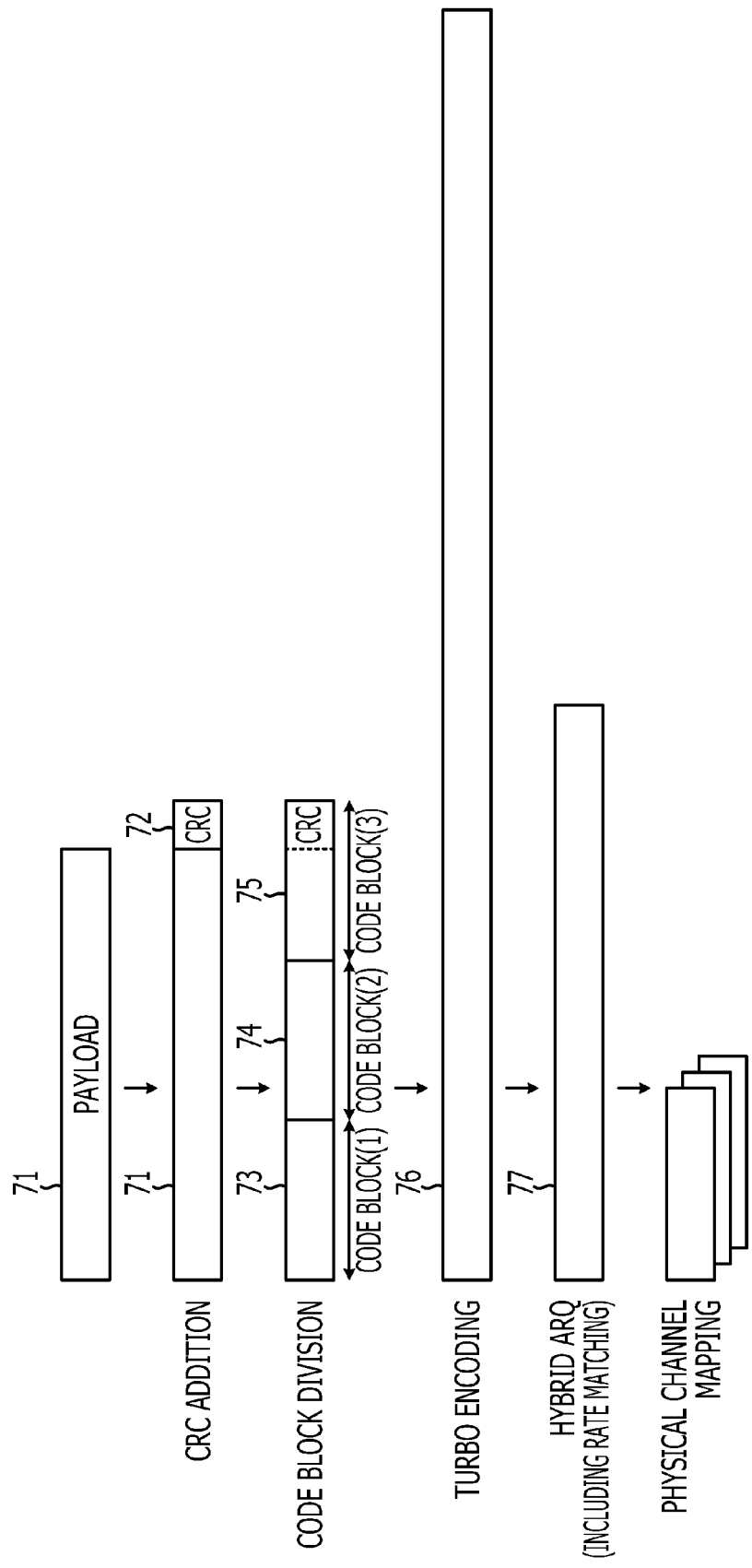
FIG. 7 illustrates an exemplary data process.

The HS-DSCH encoding unit 23 includes the code block dividing unit 62. The code block dividing unit 62 may be the dividing unit 1 illustrated in FIG. 1. The HS-DSCH encoding unit 23 includes a CRC addition unit 61, a turbo encoding unit 63, a hybrid Automatic Repeat reQuest (ARQ)/rate matching unit 64, and a physical channel mapping unit 65. FIG. 7 illustrates an exemplary data process. The HS-DSCH encoding unit 23 illustrated in FIG. 4 or 5 may execute the data process illustrated in FIG. 7.

The CRC addition unit 61 is coupled to an input terminal 66 to which payload data is supplied from a superior layer, and adds CRC information 72 to payload data 71 transmitted using the HS-DSCH. The code block dividing unit 62 divides data obtained by adding the CRC information 72 to the payload data 71 into a certain number of code blocks 73, 74, and 75. For example, the CRC information 72 may be included in the code block 75. The number of code blocks may be an arbitrary number, for example, 3.

The turbo encoding unit 63 is coupled to the code block dividing unit 62 and executes a turbo encoding process on each code block in order to combine codewords of the code blocks and generate a signal 76 subjected to the turbo encoding. The hybrid ARQ/rate matching unit 64 is coupled to the turbo encoding unit 63. The hybrid ARQ/rate matching unit 64 executes a hybrid ARQ process and a rate matching process on the signal 76 output from the turbo encoding unit 63 in order to generate a signal 77 subjected to the hybrid ARQ process and the rate matching process.

The physical channel mapping unit 65 is coupled to the hybrid ARQ/rate matching unit 64 and maps the signal 77 output from the hybrid ARQ/rate matching unit 64 to a physical channel.

Figure 8:
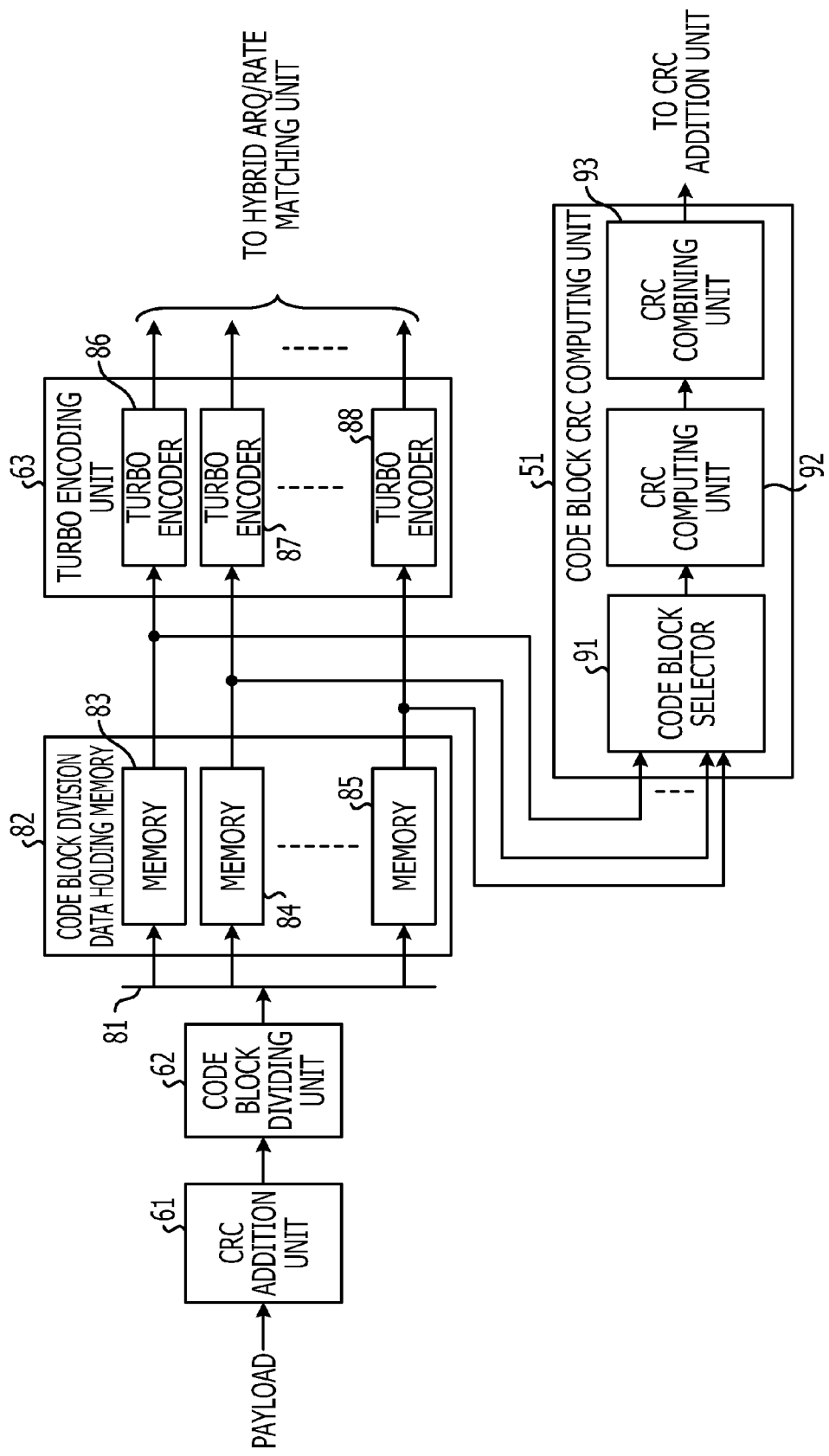
FIG. 8 illustrates an exemplary code block CRC computing unit.

FIG. 8 illustrates an exemplary a code block CRC computing unit. In the HS-DSCH encoding unit 23, the code block 73, 74, and 75 output from the code block dividing unit 62 are selected by a selector 81 and stored in corresponding memory regions 83, 84, and 85, respectively, of a code block division data holding memory 82.

In the turbo encoding unit 63, the code blocks 73, 74, and 75 output from the memory regions 83, 84, and 85, respectively, are encoded by corresponding turbo encoders 86, 87, and 88, respectively. For example, a random-access memory (RAM) included in the baseband chip 12 may be used as the code block division data holding memory 82.

The code block CRC computing unit 51 includes a code block selector 91, a CRC computing unit 92, and a CRC combining unit 93. The code block selector 91 is coupled to the memory regions 83, 84, and 85 of the code block division data holding memory 82 and sequentially selects one of the code blocks 73, 74, and 75 stored in the memory regions 83, 84, and 85, respectively.

The CRC computing unit 92 is coupled to the code block selector 91 and executes a CRC computing process on the code blocks 73, 74, and 75 sequentially selected by the code block selector 91 in order to generate CRC information for each of the code block 73, 74, and 75. The CRC combining unit 93 is coupled to the CRC computing unit 92 and combines the CRC information generated for each of the code blocks 73, 74, and 75. For example, the code block CRC computing unit 51 may serially process the code blocks 73, 74, and 75. A plurality of CRC computing units may execute the CRC computing process parallel to one another to combine the CRC information.

Figure 9:
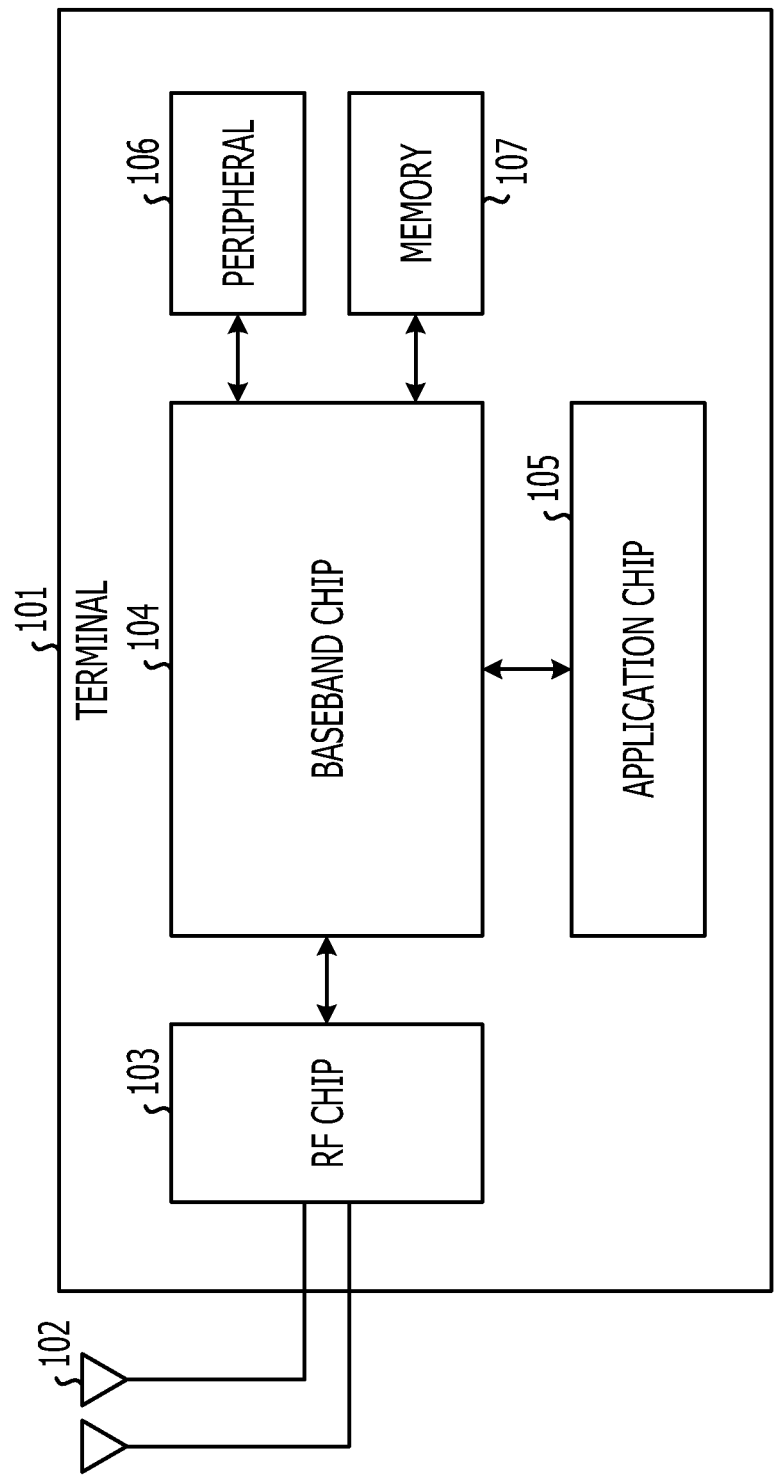
FIG. 9 illustrates an exemplary terminal.

FIG. 9 illustrates an exemplary terminal. FIG. 9 illustrates the hardware configuration of the terminal. A terminal 101 includes an antenna 102, an RF chip 103 that executes a wireless transmission/reception process, a baseband chip 104 that executes a baseband process, and an application chip 105 that executes an application. For example, the RF chip 103 may be the reception unit 4 illustrated in FIG. 1. A peripheral (peripheral device) 106, for example, input keys or a display panel for an output, or a memory 107 may be coupled to the baseband chip 104.

Figure 10:
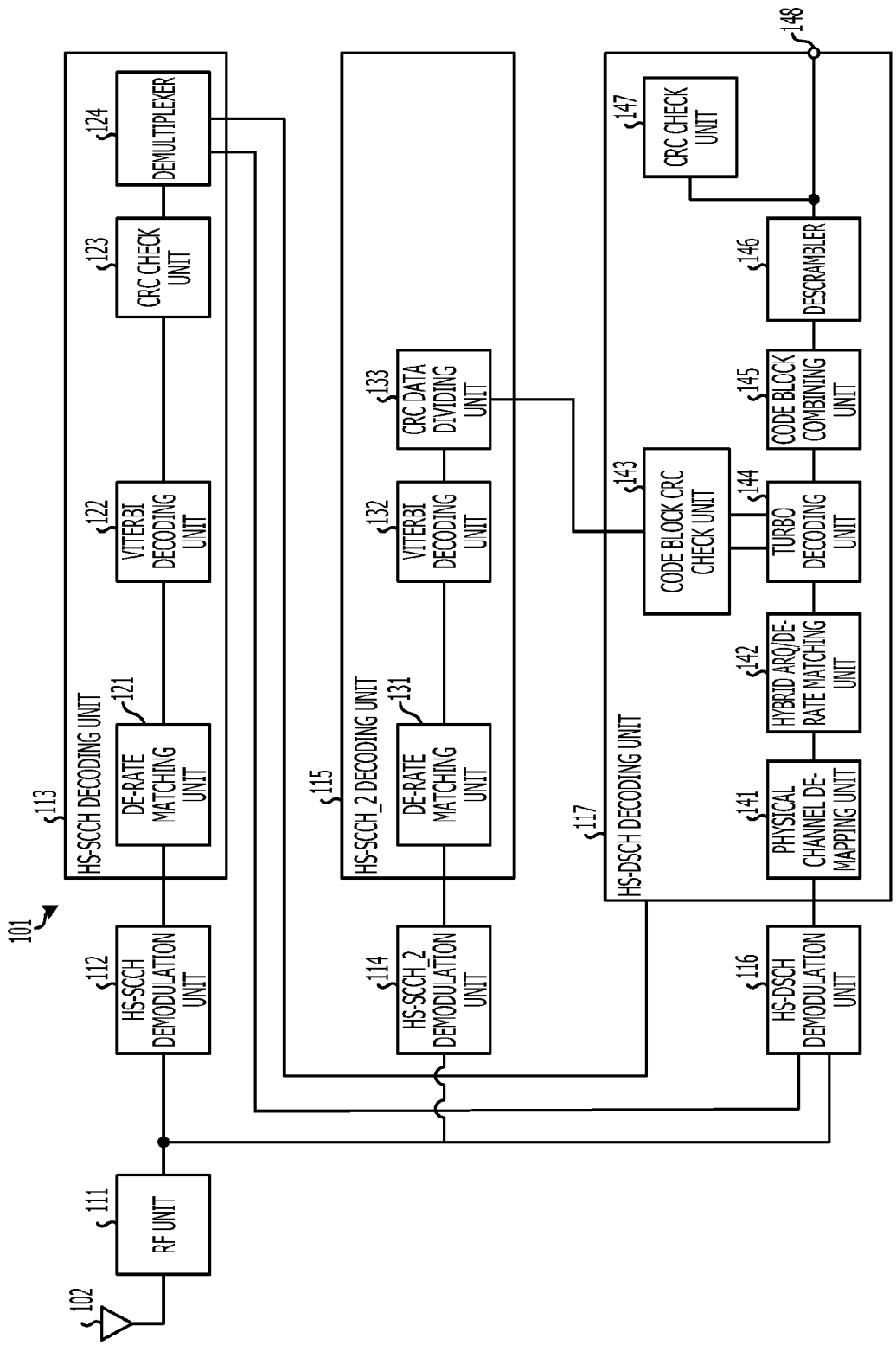
FIG. 10 illustrates an exemplary terminal.
Figure 11:
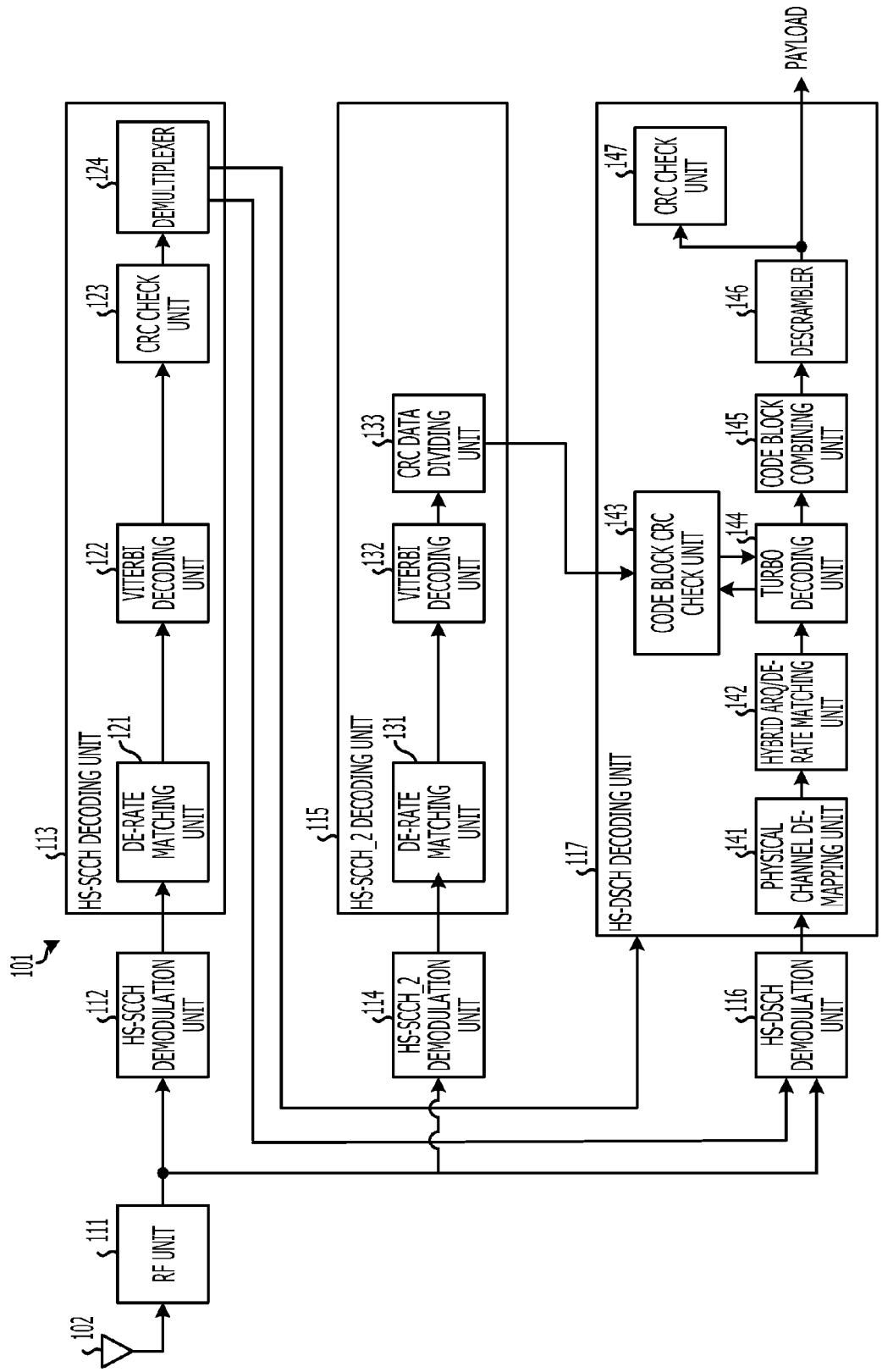
FIG. 11 illustrates an exemplary flow of a signal.

FIG. 10 illustrates an exemplary terminal 101. FIG. 10 may illustrate the functional configuration of the terminal 101. FIG. 11 illustrates an exemplary flow of a signal. The flow of the signal illustrated in FIG. 11 may be the flow of a signal in the terminal 101 illustrated in FIG. 10. The terminal 101 includes an RF unit 111, an HS-SCCH demodulation unit 112, an HS-SCCH decoding unit 113, an HS-SCCH_2 demodulation unit 114, an HS-SCCH_2 decoding unit 115, an HS-DSCH demodulation unit 116, and an HS-DSCH decoding unit 117. The RF unit 111 executes a wireless transmission/reception process.

The HS-SCCH demodulation unit 112 is coupled to the RF unit 111 and demodulates a signal transmitted using the HS-SCCH. The HS-SCCH decoding unit 113 is coupled to the HS-SCCH demodulation unit 112 and decodes a signal output from the HS-SCCH demodulation unit 112.

The HS-SCCH_2 demodulation unit 114 is coupled to the RF unit 111 and demodulates a signal transmitted using the HS-SCCH_2. The HS-SCCH_2 decoding unit 115 is coupled to the HS-SCCH_2 demodulation unit 114 and decodes a signal output from the HS-SCCH_2 demodulation unit 114.

The HS-DSCH demodulation unit 116 is coupled to the RF unit 111 and a demultiplexer 124 in the HS-SCCH decoding unit 113 and demodulates a signal transmitted using the HS-DSCH. The HS-DSCH decoding unit 117 is coupled to the HS-DSCH demodulation unit 116, the demultiplexer 124 in the HS-SCCH decoding unit 113, and a CRC data dividing unit 133 in the HS-SCCH_2 decoding unit 115 and decodes a signal output from the HS-DSCH demodulation unit 116. The HS-DSCH decoding unit 117 outputs payload data obtained as a result of the decoding to an output terminal 148.

The HS-SCCH decoding unit 113 includes a de-rate matching unit 121, a Viterbi decoding unit 122, a CRC check unit 123, and the demultiplexer 124.

The de-rate matching unit 121 is coupled to the HS-SCCH demodulation unit 112 and executes a de-rate matching process on a signal output from the HS-SCCH demodulation unit 112. The Viterbi decoding unit 122 is coupled to the de-rate matching unit 121 and executes a Viterbi decoding process on a signal output from the de-rate matching unit 121. The CRC check unit 123 is coupled to the Viterbi decoding unit 122 and executes error detection and an error correction process on data output from the Viterbi decoding unit 122 based on CRC information added to the output data.

The demultiplexer 124 is coupled to the CRC check unit 123. The demultiplexer 124 outputs HS-DSCH demodulation control information included in data judged to include no error as a result of the error detection executed by the CRC check unit 123 to the HS-DSCH demodulation unit 116, as well as outputting HS-DSCH decoding control information to the HS-DSCH decoding unit 117.

The HS-SCCH_2 decoding unit 115 includes a de-rate matching unit 131, a Viterbi decoding unit 132, and the CRC data dividing unit 133.

The de-rate matching unit 131 is coupled to the HS-SCCH_2 demodulation unit 114 and executes a de-rate matching process on a signal output from the HS-SCCH_2 demodulation unit 114. The Viterbi decoding unit 132 is coupled to the de-rate matching unit 131 and executes a Viterbi decoding process on a signal output from the de-rate matching unit 131.

The CRC data dividing unit 133 is coupled to the Viterbi decoding unit 132 and divides CRC data included in data output from the Viterbi decoding unit 132 into CRC information for each code block.

The HS-DSCH decoding unit 117 includes a physical channel de-mapping unit 141, a hybrid ARQ/de-rate matching unit 142, a code block CRC check unit 143, a turbo decoding unit 144, a code block combining unit 145, a descrambler 146, and a CRC check unit 147. For example, the code block CRC check unit 143 may be the detection unit 5 illustrated in FIG. 1.

The physical channel de-mapping unit 141 is coupled to the HS-DSCH demodulation unit 116 and executes a physical channel de-mapping process on a signal output from the HS-DSCH demodulation unit 116. The hybrid ARQ/de-rate matching unit 142 is coupled to the physical channel de-mapping unit 141 and executes a hybrid ARQ process and a de-rate matching process on a signal output from the physical channel de-mapping unit 141.

The turbo decoding unit 144 is coupled to the hybrid ARQ/de-rate matching unit 142 and executes a turbo decoding process on a signal output from the hybrid ARQ/de-rate matching unit 142. The code block CRC check unit 143 is coupled to the CRC data dividing unit 133 in the HS-SCCH_2 decoding unit 115 and the turbo decoding unit 144. The code block CRC check unit 143 executes error detection and an error correction process on decoded data output from the turbo decoding unit 144 for each code block based on CRC information for each code block.

The turbo decoding unit 144 repeats the turbo decoding process and the code block CRC check unit 143 repeats the error detection and the error correction process for each code block until an error is no longer detected as a result of the error detection. When no error has been detected as a result of the error detection, the code block CRC check unit 143 causes the turbo decoding unit 144 to stop the turbo decoding process and the repetition (iteration) of the error detection and the error correction process is stopped.

The code block combining unit 145 is coupled to the turbo decoding unit 144 and combines pieces of decoded data for the code blocks output from the turbo decoding unit 144. The descrambler 146 is coupled to the code block combining unit 145 and executes a descrambling process on data output from the code block combining unit 145 in order to generate payload data. The CRC check unit 147 is coupled to the descrambler 146 and executes error detection and an error correction process on data output from the descrambler 146 based on CRC information added to the output data.

Figure 12:
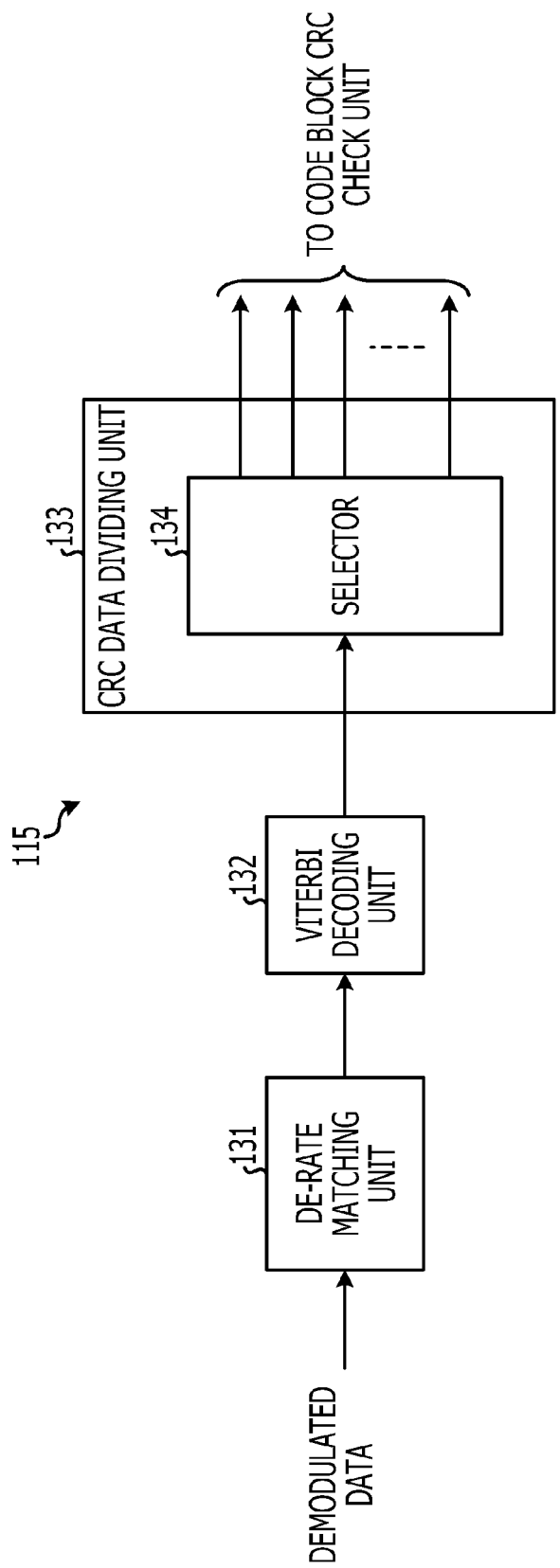
FIG. 12 illustrates an exemplary CRC data dividing unit.

FIG. 12 illustrates an exemplary CRC data dividing unit 133. The CRC data dividing unit 133 includes a selector 134. The selector 134 is coupled to the Viterbi decoding unit 132 and divides data output from the Viterbi decoding unit 132 into pieces of data, each having a certain data length, in order to generate CRC data for each code block. For example, the selector 134 may output pieces of CRC data for the code blocks parallel to one another.

Figure 13:
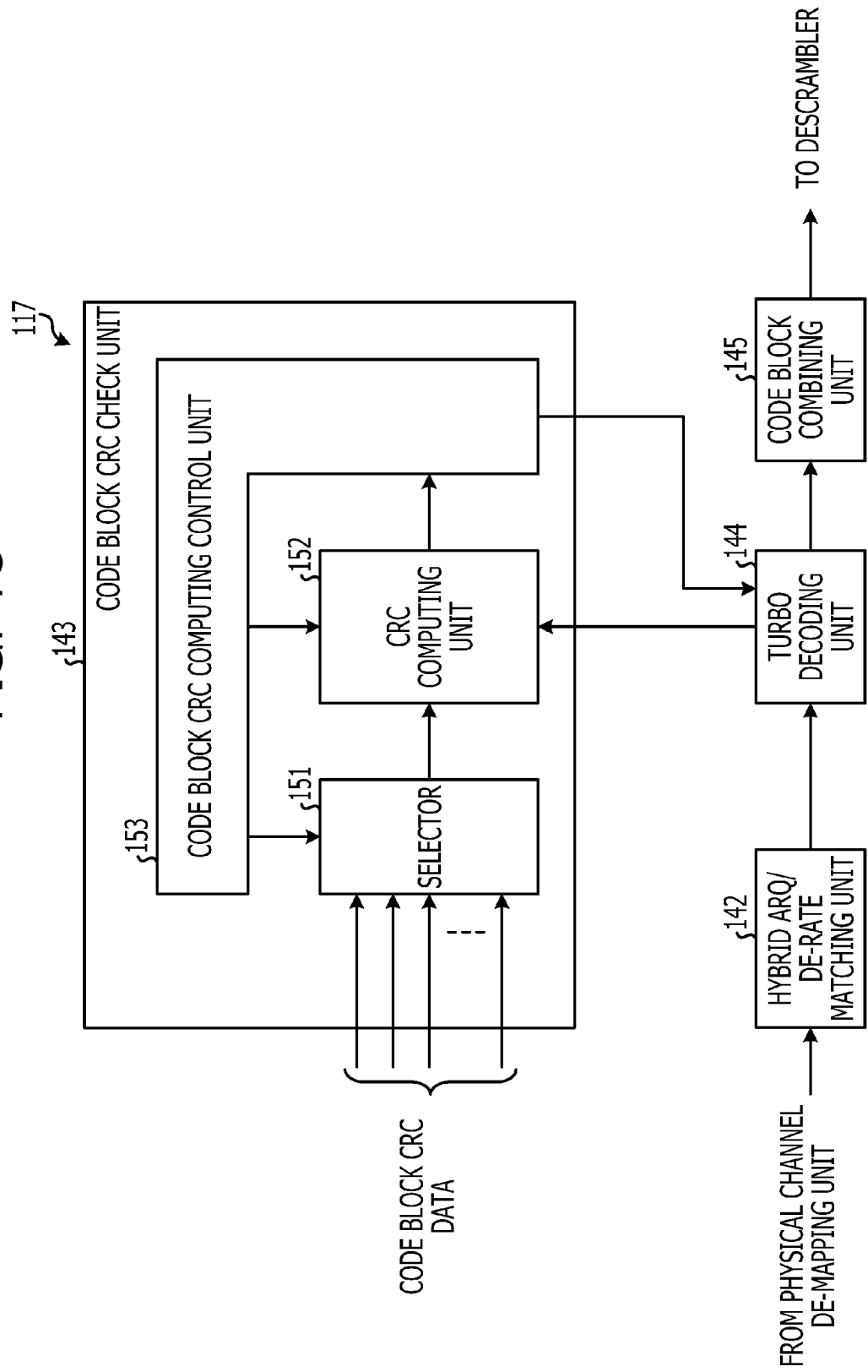
FIG. 13 illustrates an exemplary CRC check unit.

FIG. 13 illustrates an exemplary CRC check unit. The CRC check unit illustrated in FIG. 13 may be a code block CRC check unit. The code block CRC check unit 143 includes a selector 151, a CRC computing unit 152, and a code block CRC computing control unit 153.

The selector 151 is coupled to the selector 134 in the CRC data dividing unit 133 and sequentially selects a piece of CRC data for each of the code blocks supplied from the selector 134 in the CRC data dividing unit 133 parallel to one another. The CRC computing unit 152 is coupled to the selector 151 and the turbo decoding unit 144 and executes error detection and an error correction process (CRC check) on each code block through the iteration based on turbo decoding data and CRC data.

The code block CRC computing control unit 153 is coupled to the selector 151, the CRC computing unit 152, and the turbo decoding unit 144. The code block CRC computing control unit 153 controls the selection of CRC data for each code block executed by the selector 151 and instructs the CRC computing unit 152 to begin the error detection and the error correction process. The code block CRC computing control unit 153 instructs the turbo decoding unit 144 to either continue or stop the turbo decoding process based on results of the error detection executed by the CRC computing unit 152.

As illustrated in FIG. 6, the HS-SCCH may be divided into a first half (1 slot) and a second half (2 slot). The first half of the HS-SCCH includes information for demodulation of the HS-DSCH. The second half of the HS-SCCH includes information for decoding of the HS-DSCH. The HS-SCCH demodulation unit 112 and the HS-SCCH decoding unit 113 may be used for both the process for the first half of the HS-SCCH and the process for the second half of the HS-SCCH.

In the terminal 101, the HS-SCCH demodulation unit 112 and the HS-SCCH decoding unit 113 execute a demodulation process and a decoding process, respectively, for the first half of the HS-SCCH. The HS-DSCH demodulation control information may be obtained. The HS-DSCH demodulation unit 116 begins a demodulation process of the HS-DSCH based on the HS-DSCH demodulation control information. At substantially the same time as the beginning of the demodulation process for the HS-DSCH, the HS-SCCH demodulation unit 112 and the HS-SCCH decoding unit 113 execute a demodulation process and a decoding process, respectively, for the second half of the HS-SCCH. The HS-DSCH decoding control information may be obtained.

With regard to the HS-SCCH_2, a demodulation process and a decoding process may be completed before a decoding process for the HS-DSCH begins. The demodulation process and the decoding process for the HS-SCCH_2 may begin at substantially the same time as the beginning of the processes for the second half of the HS-SCCH. As a result of the demodulation process and the decoding process for the HS-SCCH_2 executed by the HS-SCCH_2 demodulation unit 114 and the HS-SCCH_2 decoding unit 115, CRC information (CRC data) for each code block may be obtained.

The HS-DSCH decoding unit 117 executes the decoding process for the HS-DSCH based on the HS-DSCH decoding control information and the CRC information for each code block.

Figure 14:
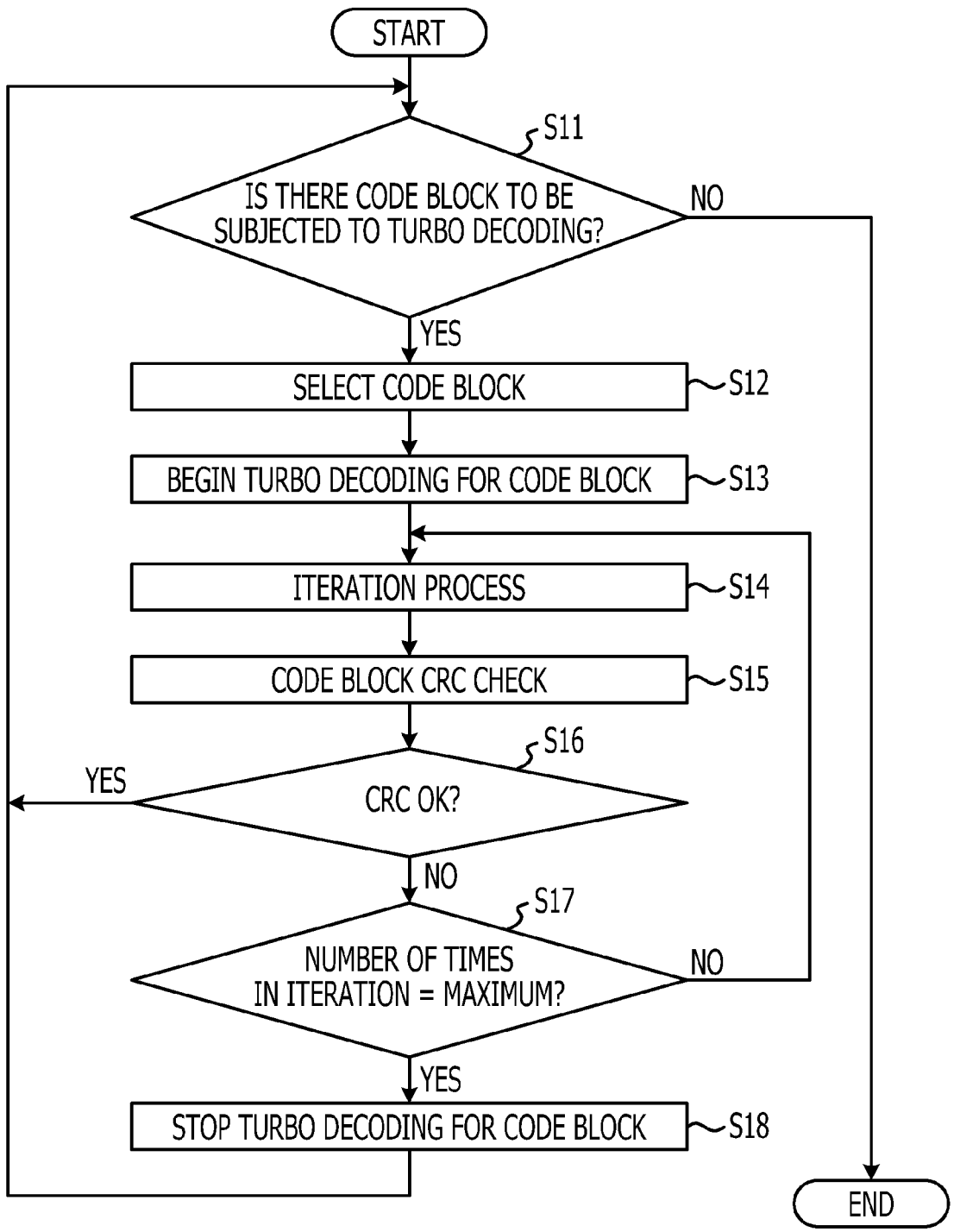
FIG. 14 illustrates an exemplary decoding operation.

FIG. 14 illustrates an exemplary decoding operation. If there is a code block to be turbo-decoded (YES in an operation S11), the terminal 101 selects a code block to be decoded (an operation S12). The turbo decoding unit 144 in the terminal 101 begins a turbo decoding process on the selected code block (an operation S13), and an iteration process is executed (an operation S14).

The CRC computing unit 152 in the terminal 101 executes a CRC check, for example, error detection and an error correction process, on the selected code block (an operation S15). If there is no error, for example, if "CRC OK" is established (YES in an operation S16), the process returns to the operation S11. The terminal 101 repeats the processes in the operation S11 and the subsequent operations for another code block.

If there is an error, for example, if "CRC OK" is not established (NO in the operation S16), the terminal 101 repeats the processes from operation S14 to operation S17 until these processes are repeated for the maximum number of times determined in advance in the iteration (NO in the operation S17) or until "CRC OK" is established in operation S16 (YES in the operation S16).

If these processes are repeated for the maximum number of times in the iteration (YES in the operation S17), the code block CRC computing control unit 153 in the terminal 101 stops the turbo decoding process for a code block that is being decoded (an operation S18). The process returns to the operation S11, and the terminal 101 repeats the processes in the operation S11 and the subsequent operations for another code block. If there is no code block to be turbo-decoded (NO in the operation S11), the terminal 101 terminates the decoding operation.

Since the terminal 101 executes the error detection and the error correction process for each code block through the iteration, the decoding process is stopped when the error correction decoding has been completed for each code block. Therefore, redundant repetition of the error detection and the error correction process may be reduced, thereby reducing the power consumption of the terminal 101.

The functions illustrated in FIG. 4, 8, 10, 12, or 13 may be executed by hardware, or may be executed by software using a processor.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A wireless communication system comprising:
a first adder to add first error detection information to data;
a divider to divide the data into a plurality of first code blocks;
a generator to generate second error detection information for each of the plurality of code blocks and combine the second error detection information for each of the plurality of code blocks to generate combined error information;
a second adder to add third error detection information to the combined error information;
a transmitter to wirelessly transmit the plurality of first code blocks using a first channel and the combined error information using a second channel;
a receiver to receive the plurality of first code blocks and the combined error information transmitted wirelessly; and
a detector to execute error detection on each of the plurality of first code blocks from the receiver using the combined error information from the receiver and to control a continuation of the error detection for the code blocks based on a result of the error detection.

2. The wireless communication system according to claim 1,
wherein the detector repeats the error detection at least once for each of the plurality of first code blocks and stops the repetition of the error detection when no error is detected.

3. The wireless communication system according to claim 1,
wherein the second channel is a channel used to transmit control information.

4. A wireless communication apparatus comprising:
a receiver to receive a plurality of code blocks and combined error information in which first error detection information for each of the plurality of code blocks are combined and second error detection information is added after combining the plurality of code blocks being transmitted using a first channel and the combined error information being transmitted using a second channel; and
a detector to execute error detection on each of the plurality of code blocks using the combined error information and to control a continuation of the error detection for the plurality of code blocks based on a result of the error detection.

5. The wireless communication apparatus according to claim 4,
wherein the detector repeats the error detection at least once for each of the plurality of code blocks and stops the repetition of the error detection when no error is detected.

6. A wireless communication apparatus comprising:
a first adder to add first error detection information to data;
a divider to divide the data into a plurality of code blocks;

a generator to generate second error detection information for each of the plurality of code blocks and combine the second error detection information for each of the plurality of code blocks to generate combined error information;

a seconder adder to add third error detection information to the combined error information; and a transmitter to wirelessly transmit the plurality of code blocks using a first channel and the combined error information using a second channel.

7. The wireless communication apparatus according to claim 6, wherein the second channel is a channel used to transmit control information.

8. A wireless communication method comprising:

adding first error detection information to data;

dividing the data into a plurality of code blocks by a wireless communication apparatus on a transmission side;

generating second error detection information for each of the plurality of code blocks;

combining the second error detection information for each of the plurality of code blocks to generate combined error information;

adding third error detection information to the combined error information; and transmitting wirelessly at least one of the plurality of code blocks using a first channel and the combined error information using a second channel.

9. The wireless communication method according to claim 8, further comprising:

receiving, by a wireless communication apparatus on a reception side, the plurality of code blocks and the combined error information wirelessly transmitted; executing error detection on each of a received code blocks using the combined error information; and controlling a continuation of the error detection for the plurality of code blocks based on result of the error detection;

repeating the error detection at least once for each of the received code blocks; and stopping the repetition of the error detection when no error is detected.

10. The wireless communication method according to claim 8, wherein the second channel is a channel used to transmit control information.

11. A wireless communication method comprising:

receiving a plurality of code blocks and combined error information in which first error detection information for each of the plurality of code blocks are combined and second error detection information is added after combining, the plurality of code blocks being transmitted using a first channel and combined error information being transmitted using a second channel;

executing error detection on each of the plurality code blocks using the combined error information; and controlling an continuation of the error detection for the plurality of code blocks based on a result of the error detection.

12. The wireless communication method according to claim 11, further comprising:

repeating the error detection at least once for each of the plurality of code blocks; and stopping the repetition of the error detection when no error is detected.

* * * * *